US011626161B2

(12) United States Patent
Mantegazza et al.

(10) Patent No.: US 11,626,161 B2
(45) Date of Patent: Apr. 11, 2023

(54) SELECTION SCHEME FOR CROSSPOINT MEMORY

(71) Applicant: Intel Corporation, Santa Clara, CA (US)

(72) Inventors: Davide Mantegazza, Palo Alto, CA (US); Kyung Jean Yoon, Santa Clara, CA (US); John Gorman, San Jose, CA (US); Dany-Sebastien Ly-Gagnon, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/368,634

(22) Filed: Jul. 6, 2021

(65) Prior Publication Data

US 2021/0335419 A1 Oct. 28, 2021

Related U.S. Application Data

(63) Continuation of application No. 16/831,639, filed on Mar. 26, 2020, now Pat. No. 11,100,987.

(51) Int. Cl.
  *G11C 16/10* (2006.01)
  *G11C 13/00* (2006.01)
  *G11C 11/56* (2006.01)

(52) U.S. Cl.
  CPC ........ *G11C 13/003* (2013.01); *G11C 11/5678* (2013.01); *G11C 13/0004* (2013.01);
  (Continued)

(58) Field of Classification Search
  CPC .............. G11C 13/003; G11C 11/5678; G11C 13/0004; G11C 13/004; G11C 13/0069; G11C 2013/0045; G11C 2013/0078; G11C 2211/5645; G11C 2213/79; G11C 13/0038; G11C 13/0061; G11C 13/0028;
  (Continued)

(56) References Cited

U.S. PATENT DOCUMENTS 8,559,209 B2 * 10/2013 Siau ...................... G06F 3/0688
                                                              365/163
9,685,213 B2   6/2017 Ly-Gagnon et al.
(Continued)

OTHER PUBLICATIONS

Extended European Search Report for Patent Application No. 20207989.3, dated Apr. 28, 2021, 10 pages.
(Continued)

*Primary Examiner* — Xiaochun L Chen
(74) *Attorney, Agent, or Firm* — Compass IP Law PC

(57) ABSTRACT

A selection scheme for crosspoint memory is described. In one example, the selection voltage applied across the memory cell is slowly ramped up. Once the memory cell thresholds, the voltage is reduced to a level for performing the read or write operation. Reducing the voltage once the specific cell has been selected (e.g., thresholds) minimizes the additional transient current which might be generated by further increasing the selection bias applied during read or write operation. The reduction in transient current can lead to an improvement in read disturb and write endurance issues. The selection ramp-rate and bias post-selection can be set differently depending on the cell location inside the memory array to further improve cell performance.

19 Claims, 7 Drawing Sheets

(52) U.S. Cl.
CPC ........ *G11C 13/004* (2013.01); *G11C 13/0069* (2013.01); *G11C 2013/0045* (2013.01); *G11C 2013/0078* (2013.01); *G11C 2211/5645* (2013.01); *G11C 2213/79* (2013.01)

(58) Field of Classification Search
CPC ... G11C 13/0033; G11C 13/0026; G11C 7/12; G11C 8/08
See application file for complete search history.

(56) References Cited

U.S. PATENT DOCUMENTS

| | | |
|---|---|---|
| 2006/0146600 A1 | 7/2006 | Johnson |
| 2016/0005461 A1 | 1/2016 | Jo et al. |
| 2017/0053698 A1 | 2/2017 | Ly-Gagnon et al. |
| 2017/0309335 A1 | 10/2017 | Mori et al. |

OTHER PUBLICATIONS

First Office Action for U.S. Appl. No. 16/831,639, dated Jan. 22, 2021, 15 pages.
Notice of Allowance for U.S. Appl. No. 16/831,639, dated Apr. 28, 2021, 8 pages.

\* cited by examiner

SELECTION SCHEME FOR CROSSPOINT MEMORY

CLAIM OF PRIORITY

This application is a Continuation of, and claims the benefit of priority of, U.S. patent application Ser. No. 16/831,639 filed Mar. 26, 2020, which is incorporated herein by reference in its entirety.

FIELD

The descriptions are generally related to memory, and more particularly, to improved techniques for accessing crosspoint memory.

BACKGROUND

Memory resources have innumerable applications in electronic devices and other computing environments. There is demand for memory technologies that can scale smaller than traditional memory devices. However, continued drive to smaller and more energy efficient devices has resulted in scaling issues with traditional memory devices. Three-dimensional memory devices emerged as a solution to the scaling limitations of traditional memory devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

A selection scheme for crosspoint memories is described.

Typically, prior to reading from or writing to a crosspoint memory cell, the cell is selected. To select a memory cell, a voltage having a particular polarity, magnitude, and duration is applied across the memory cell. Once the cell is selected, a parasitic transient current may pass through the cell. The parasitic transient current resulting from selection of the memory cell is referred to as the "selection spike." The selection spike can be sufficiently large to cause reliability and performance issues such as read-disturb and write-endurance issues.

There are various ways of mitigating the selection spike. For example, the selection spike has been addressed through selector cell engineering (e.g., threshold voltage reduction), full memory cell engineering (e.g., adjusting electrode resistivity), screening from periphery capacitance outside the array, or modulating the resistance of the local wordline or bitline transistors through the applied gate voltage. However, these techniques may be insufficient to guarantee read-disturb and write-endurance requirements.

In contrast, a selection scheme that controls the ramp rate of the selection voltage waveform can reduce the effective bias required to select the memory cell and thus reduce the selection spike. In one example, the selection voltage applied across the memory cell is slowly ramped up. Once the memory cell thresholds, the voltage is reduced to a level for performing the read or write operation. Reducing the voltage once the specific cell has been selected (e.g., thresholds) minimizes the additional transient current which might be generated by further increasing the selection bias applied during read or write operation. The selection ramp-rate and bias post-selection can be set differently depending on the cell location inside the memory array to further improve cell performance.

Figure 1:
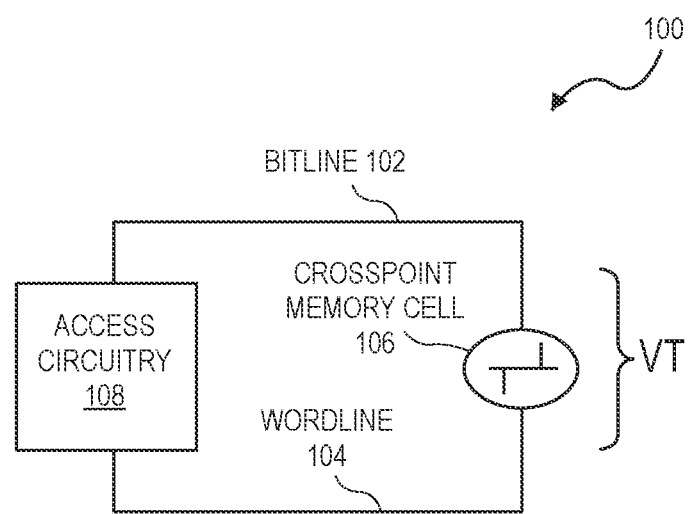
FIG. 1 is an example of a memory cell.

FIG. 1 is circuit diagram of an example of a two-terminal crosspoint memory cell that can be selected in accordance with the selection scheme described herein. The crosspoint memory cell is one of many memory cells in a crosspoint memory device. The crosspoint memory cell 106 is coupled with access circuitry via a bitline 102 and a wordline 104. The crosspoint memory cell 106 includes a material to store one or more bits. The memory element of the crosspoint memory cell 106 can include any memory element with a tunable threshold voltage. In one example, the cell 106 can be in one of multiple (e.g., 2, 4 or more) resistive states. In one such example, each different resistive state is associated with a different threshold voltage (VT). A threshold voltage is a voltage at which the cell 106 undergoes a change (e.g., a physical change) that causes the cell to be in a higher conductive state. In one example, a memory cell can be said to "threshold" or undergo a "threshold event." In one example, when a memory cell thresholds (e.g., in response to an applied voltage with a magnitude greater than the threshold voltage at the current state), the memory cell undergoes a physical change that causes the memory cell to exhibit a certain electrical characteristics, such as high conductivity. Once a cell thresholds, a program current of a particular amplitude, polarity, and duration can be applied to the cell to cause the cell to be in the desired resistive state. The value stored by the crosspoint memory cell 106 can therefore be determined by detecting the resistive state of the cell, which can be determined by detecting the current that flows through the cell in response to an applied voltage.

The memory cell 106 is coupled with circuitry 108 to enable access to and operation of the memory cell 106. The circuitry includes electronic components that are electrically coupled to perform one or more of: supplying voltages to the memory cell, sensing electrical responses of the memory cell, performing analog or logic operations on received or stored information, outputting information, and storing information. In one example, the access circuitry 108 includes circuitry to select memory cells, write to memory cells, and read from memory cells.

As mentioned briefly above, in typical crosspoint memory, a voltage is applied across the memory cell to select the memory cell prior to delivering current to perform a read or write operation. Selecting the memory cell may involving causing the memory cell (e.g., a selector device and/or memory element) to threshold or "snap." Typically, a select voltage having some predetermined, constant magnitude and duration is applied across the memory cell. However, as mentioned above, a large transient current caused by the selection typically passes through the cell, causing read disturb and write endurance problems.

In contrast to applying a single constant select voltage for the duration of the read or write operation (e.g., a rectangular select voltage waveform), a selection scheme in which the applied voltage is slowly increased until the cell thresholds and then lowered can decrease read disturb and write endurance issues.

Figure 2A:
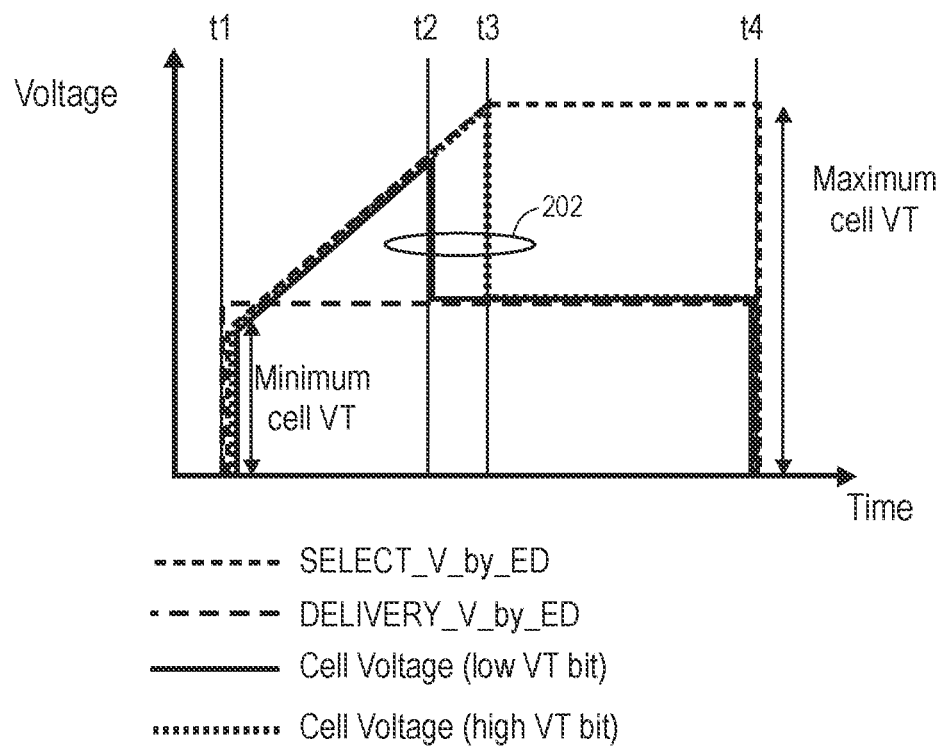
FIG. 2A illustrates an example of a waveform for selecting a memory cell.

FIG. 2A illustrates an example of a waveform for selecting a memory cell. The waveform of FIG. 2A shows voltage (y axis) versus time (x axis) for a select voltage, a delivery voltage, and cell voltages for lower and higher VT memory cells. The cell voltage represents the voltage across the memory cell. The applied voltage in this example has two components: 1) select or selection voltage (SELECT_V_by_ED) and 2) delivery voltage (DELIVERY_V_by_ED). The select voltage is a voltage to select the memory cell. In one example, the delivery voltage is a voltage to sustain the read or write current for performance of a read or write operation. The selection voltage waveform can be a stair-case up or triangular selection voltage with a slope ((MAX_CELL_V-MIN_CELL_V)/(t3-t1) in FIG. 2A) that can be controlled. As soon as the cell thresholds (e.g., either a set cell for read or write-reset, or a reset cell for write-set) the sensing signal disables the SELECT_V_by_ED path and enables the DELIVERY_V_by_ED path which provides the minimum bias to provide the read or write current.

Referring to the example in FIG. 2A, at time t1, the select voltage is applied across the memory cell. The magnitude of the initial select voltage is approximately equal to the minimum expected threshold voltage magnitude. In one example, the select voltage has a slightly lower magnitude than the minimum expected cell Vt (e.g., to guardband the cell Vt variation). The select voltage is then increased until either the memory cell thresholds or until a maximum select voltage is reached. In one example, the magnitude of the maximum select voltage is the maximum expected threshold voltage magnitude. FIG. 2A shows examples for both a low threshold voltage cell (cell voltage (low VT bit)) and high threshold voltage cell (cell voltage (high VT bit)). The low threshold voltage cell thresholds at time t2 and the high threshold voltage cell thresholds at a later time t3. Therefore, for the low threshold voltage cell, the select voltage is increased from t1 to t2 and then the applied voltage is decreased to the delivery voltage at time t2. For the high threshold voltage cell, the select voltage is increased from t1 to t3 and then the applied voltage is decreased to the delivery voltage at time t3. The lower delivery voltage is then applied across the cell for the duration of the read or write operation. Decreasing the voltage across the memory cell after the cell thresholds limits the subsequent current flowing in the cell, which limits read disturb and write endurance loss. In one example, the timing of the lower voltage is not limited by the higher VT cells. The lower voltage can be applied as soon as the cells threshold; therefore, the lower voltage can be applied sooner for the low VT cells (see 202).

Although the above described examples refer to situations in which the delivery voltage has a lower magnitude than the select voltage, it may be possible for some memory cells to threshold at a lower magnitude voltage than the delivery voltage. For example, if the lowest VT cells have a threshold voltage that is lower in magnitude than the delivery voltage, some cells may threshold before the select voltage is ramped up to a level that is higher than the delivery voltage. In such an example, switching from the select voltage path to the delivery voltage path could result in an increase in the voltage applied across the memory cell. However, in such an extreme case where the cell threshold voltage is minimal, the resulting spike impact is expected to be substantially low enough.

In the example illustrated in FIG. 2A, the select voltage is continuously increased with a constant rate of increase (e.g., constant slope). Thus, the select voltage of FIG. 2A increases linearly and has a triangular waveform. Controlling the slope of the select voltage ramp up enables controlling the magnitude of the current spike resulting from selection of the memory cell. For example, setting the slope (dV/dt) of the select voltage to be as low as possible given timing constraints can minimize the current spike. The selection voltage and delivery voltage can be the same or set differently depending on the cell position in the array (e.g., by electrical distance (ED) relative to the decoder). For example, the initial select voltage, the maximum select voltage, the delivery voltage, and/or the rate of increase of the select voltage can be selected from multiple voltages based on a location of the memory cell in the crosspoint memory array.

Figure 2B:
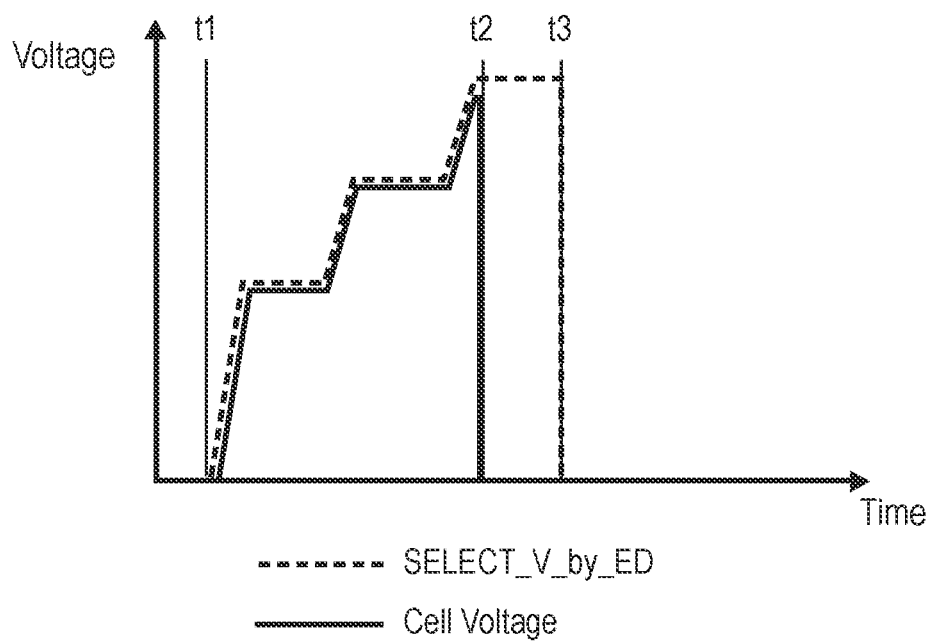
FIG. 2B illustrates an example of a waveform for selecting a memory cell.

FIG. 2B illustrates another example of a select voltage waveform. Like the waveform in FIG. 2A, the select voltage increases from an initial voltage with a lower magnitude to a voltage with a larger magnitude. However, unlike the waveform in FIG. 2A which illustrates a slow continuous ramp-up of the select voltage, FIG. 2B illustrates a staircase waveform in which the voltage is increased in steps. In both cases, once the cell thresholds, the voltage is decreased to a lower voltage (not shown in FIG. 2B) to enable the read or write operation to be completed at a lower magnitude voltage.

Thus, the SELECT_V_by_ED starts from a minimum bias value (to select cells exhibiting the minimum cell VT) to a maximum bias value (to select cells exhibiting the maximum cell VT). In one example, the select voltage is increased at the minimum ramp rate during the selection phase. The minimum ramp rate may be based on, for example, time constraints (e.g., constraints to comply with a specification) for selection for completion of a read or write operation.

Figure 3:
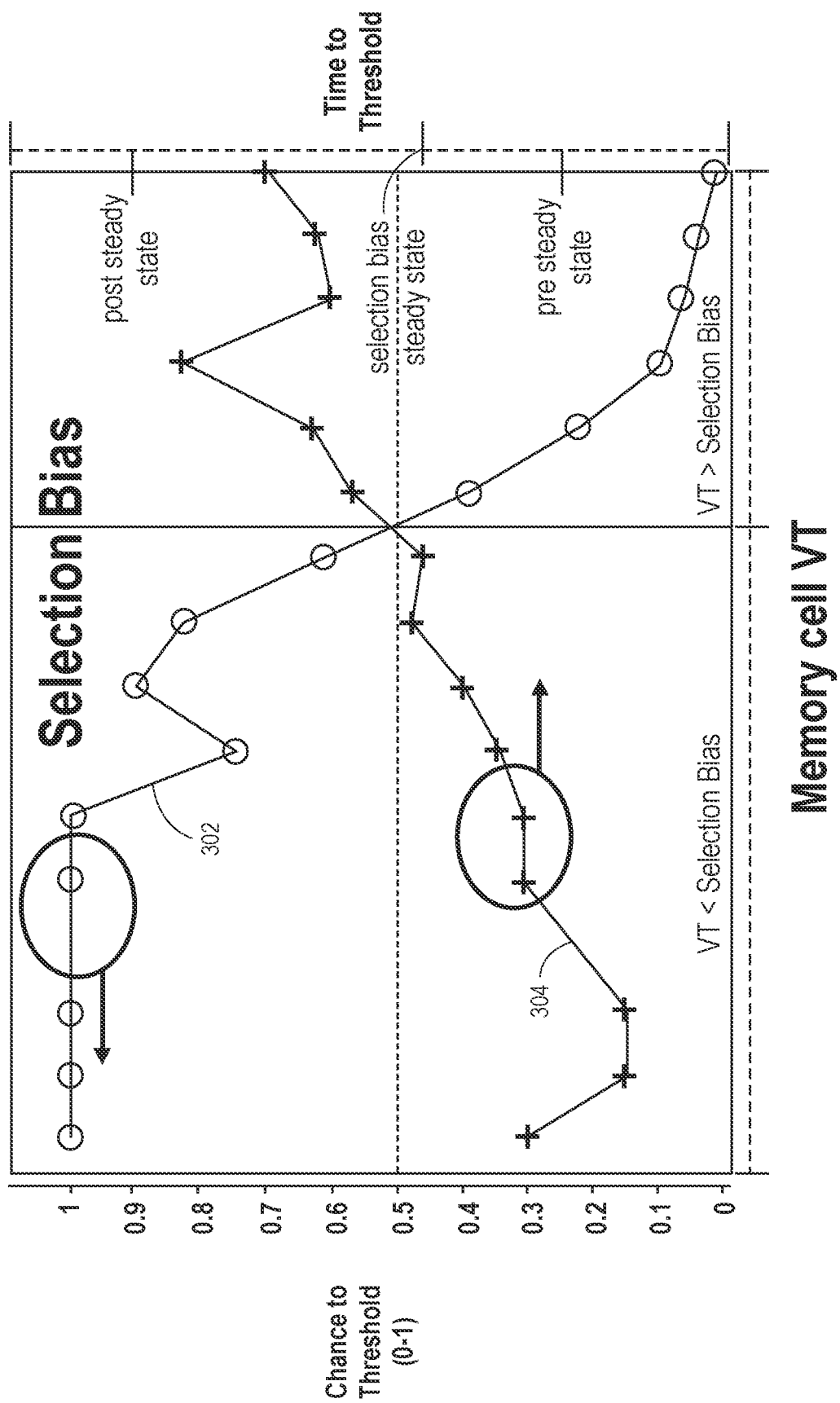
FIG. 3 is a graph showing an example of memory cell threshold voltage versus the chance to threshold and time to threshold at a given selection bias.

The graph in FIG. 3 shows an example of memory cell threshold voltage (x-axis) versus the chance to threshold (y-axis left) (see 302) and time to threshold at a given selection bias (y-axis right) (see 304). The example in FIG. 3 depicts a selection bias between the lowest and highest threshold voltages. Given that there are cells in different VT states, some cells have a VT that is lower than the selection bias and some cells have a VT that is higher than the selection bias. Cells with a threshold voltage that is significantly lower than the selection bias are all selected (e.g., the chance to threshold is approximately 1 on the y-axis left). For these cells with a lower threshold voltage, the threshold event happens before reaching the applied voltage steady state value (the threshold occurs prior to the selection bias reaching a steady state). Cells with a threshold voltage around the same magnitude as the selection bias were selected 50% of the time (e.g., the chance to threshold is approximately 0.5 on the y-axis left). For these cells with a threshold voltage equal to the selection bias, the cells threshold roughly when the applied bias reaches steady state across the cell. Cells with a threshold voltage that is greater than the selection voltage have a less than 50% chance to threshold (e.g., chance to threshold is <0.5 on the y-axis left) if the selection bias is applied for a time after reaching steady state. However, applying the same bias for longer time may increase the chance to threshold a cell compared to applying the same bias for shorter time.

Since the selection transient current resulting from selection is proportional to the bias across the cell at threshold, high VT cells are at higher risk for read-disturb and write-endurance problems. Applying a selection bias as slowly as possible increases the likelihood of selecting high VT cells at a lower bias and thus reduce the selection spike, which can improve read-disturb and write-endurance. After the cell is selected, limiting the subsequent current flowing in the cell can also limit read-disturb and write-endurance loss.

Figure 4A:
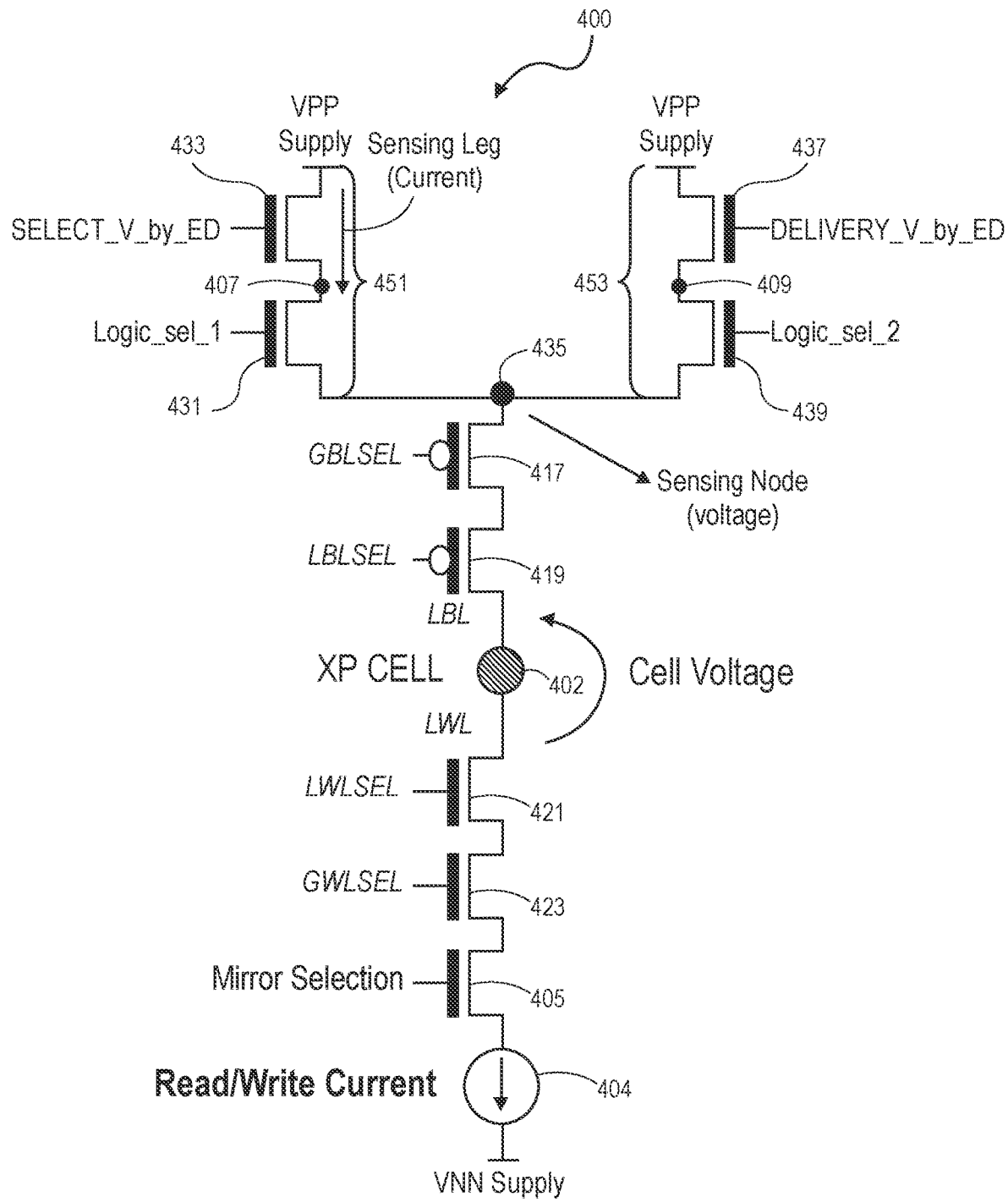
FIG. 4A illustrates an example of a circuit topology to implement a selection scheme.

FIG. 4A illustrates an example of a circuit topology to implement a selection scheme. The circuit 400 includes a memory cell 402. The memory cell 402 can be the same as, or similar to, the memory cell 106 described above with respect to FIG. 1. In the illustrated example, the memory cell 402 has one terminal that is coupled with the supply voltage VPP and another terminal that is coupled with the supply voltage VNN. In this example, VPP is on the bitline side and VNN is on the wordline side, so the supply voltages could alternatively be referred to as bitline supply voltage and the wordline supply voltage, respectively. In one example, VPP is the maximum positive supply voltage and VNN is the maximum negative supply voltage. However, the supply voltages may be different than illustrated in FIG. 4A (e.g., the bitline supply voltage may be negative and the wordline supply voltage may be positive, or both supply voltages can have the same polarity).

The circuit 400 also includes selection transistors (which can also be referred to as decoding transistors) between the memory cells and the supply voltages. For example, the circuit includes a global bit line selection transistor 417, a local bit line selection transistor 419, a local word line selection transistor 421, and a global word line selection transistor 423. Corresponding signals are applied to the gates of the selection transistors to enable selection of the memory cell 402. For example, a global bitline select (GBL_SEL) signal is applied to the gate of the global bitline select or turn on the transistor 417. A local bitline select (LBL_SEL) signal is applied to the gate of the local bitline select or turn on the transistor 419. A local wordline select (LWL_SEL) signal is applied to the gate of the local wordline select or turn on transistor 421. A global wordline select (GWL_SEL) signal is applied to the gate of the global wordlines select or turn on transistor 423. Turning on the selection transistors (e.g., by applying a pre-determined voltage to the gate of the transistors) enables selection of the cell for reading or writing. In the illustrated example, the transistors 417 and 419 are connected to VPP and transistors 421 and 423 are connected to VNN. Thus, in the illustrated example, transistors 417 and 419 are shown as PMOS transistors and transistors 421 and 423 are shown as NMOS transistors. One or more additional transistors (such as the transistor 405) can be included between the selection transistors and one or more current mirrors to enable the desired current mirror for the operation. A single current source 404 is illustrated to supply the current to perform read and write operations; however, the circuit 400 can include more than one current source.

Once the selection/decoding transistors are turned on to enable selection of the memory cell 402, a voltage is applied across the memory cell to select the memory cell. In one example, selecting the memory cell involves applying a voltage across the memory cell, which causes the memory cell to threshold (e.g., thresholding the selector device and/or the memory element of the memory cell 402). In an example in which the memory cell 402 includes a selector element in series with a storage element, the storage element has its own threshold voltage which is the minimum bias that needs to be applied to turn-on the selector and operate on the storage element. In one such example, the storage element can be simply conductive (e.g., a "set" or logic 1 state) or it can also have a threshold voltage (e.g., a "reset" or logic 0 state). In one example, during a read operation, a voltage only sufficient to select a set bit is applied. In one example, during a write operation, either a voltage sufficient to select a set bit is applied (e.g., for a reset-write operation) or a higher voltage sufficient to select a reset bit is applied (e.g., for a set-write). Typically, the applied select voltage is constant during the selection operation and/or during the read or write operation.

Unlike in conventional select schemes, an improved selection scheme involves starting at a lower minimum select voltage and slowly increasing the select voltage to a higher voltage, such as explained above with respect to FIGS. 2A and 2B. Increasing the select voltage can include a slow continuous ramp-up, a step-wise increase (e.g., staircase) or other pulse shape. Referring to the circuit 400 of FIG. 4A, the slowly increased select voltage (select_V_by_ED) is applied to the gate of the transistor 433. The transistor 433 enables application of a voltage across the memory cell 402. In one example, the transistor 433 is a cascode or source follower transistor that passes a bias applied to its gate to its source terminal. In this way, the voltage SELECT_V_by_ED applied to the gate of the transistor 433 can be applied to the node 407 at the source of transistor 433. The source follower in FIG. 4A is one example of a circuit for applying a voltage across the memory cell; other circuits for applying a select voltage across the memory cell may be used.

The memory cell 402 thresholds in response to the application of the ramping select voltage. Depending on the threshold voltage of the cell, the memory cell may threshold earlier (for low VT cells) or later once the select voltage has been increased (for high VT cells). A circuit for detecting the thresholding of the memory cell can be coupled with the node 435 between a selection transistor (e.g., transistor 417) and the supply voltage (e.g., VPP). Detection of the thresholding of the memory cell can involve detecting a change in voltage across or current through the memory cell in response to application of the select voltage.

As soon as the thresholding of the memory cell 402 is detected, the bitline path is switched from the select voltage to a delivery voltage. In the example of FIG. 4A, the circuit 400 includes two paths 451 and 453 between the supply voltage and the memory cell 402 for applying a voltage across the memory cell 402. To select the memory cell, the path 451 is selected by turning on the transistor 431 (e.g., with the signal Logic_sel_1). The path 453 is unselected by turning off the transistor 439 (e.g., with the signal Logic_sel_2). The slowly ramping select voltage (e.g., SELECT_V_by_ED) can then be applied to the gate of the transistor 433 to generate a voltage across the memory cell. Once the memory cell thresholds in response to the select voltage, the bitline path is switched from the path 451 to the path 453. To select the path 453, the transistor 439 is turned on and the transistor 431 is turned off.

Switching the bitline path from the path 451 to the path 453 enables switching from the selection voltage to the delivery voltage. In the example of FIG. 4A, the delivery voltage (DELIVERY_V_by_ED) is applied to the gate of the transistor 437 to generate a voltage across the memory cell 402. Thus, like the transistor 433 for providing a select voltage, the transistor 437 is a cascode transistor that passes a bias applied to its gate to its source terminal. In this way, the voltage DELIVERY_V_by_ED applied to the gate of the transistor 433 can be applied to the node 409 at the source of transistor 437. Other circuits for applying a delivery voltage across the memory cell may be used.

Although the circuit in FIG. 4A shows the voltage during the read or write operation as being modulated from the bitline side, the technique described herein can be extended to the case where the voltage is modulated from the wordline side or partially from the bitline and partially from the wordline side. For example, the circuitry for generating a voltage across the memory cell located on the bitline side (e.g., between bitline selection transistors and a bitline-side supply) can be located on the wordline side in addition to, or instead of, the bitline side. Thus, generating a bias across the memory cell 402 can be accomplished by applying a voltage from one or both of the wordline side and the bitline side of the memory cell.

Figure 4B:
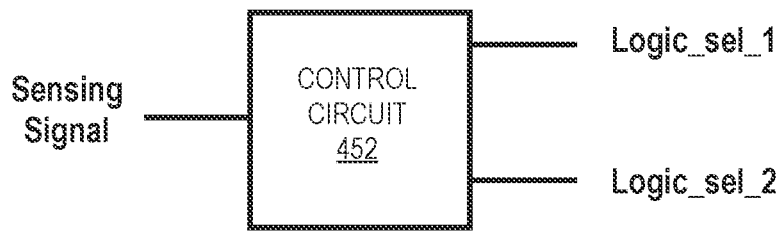
FIG. 4B is a block diagram of an example of a control circuit.

FIG. 4B is a block diagram of a control circuit for switching from the select voltage to the delivery voltage when the thresholding of the memory cell is detected. The control circuit 452 receives an input signal (sensing signal). The sensing signal can be a voltage (e.g., the voltage at the node 435 of the circuit 400 of FIG. 4A), the current through the memory cell path, or other signal that can provide an indication of whether the memory cell has been selected. The control circuit 452 includes circuitry, such as a sense amplifier and/or other circuitry, to detect a change in the sensing signal that indicates the memory cell has thresholded. For example, a decrease in the magnitude of a voltage sensing signal or an increase in the magnitude of a current sensing signal may indicate that the memory cell thresholded.

In the example in FIG. 4B, if the control circuit 452 detects that the memory cell has not thresholded, the Logic_sel_1 signal is high and the Logic_sel_2 signal is low, which selects or enables the select voltage path and deselects or disables the delivery voltage path. If the control circuit 452 detects that the memory cell has thresholded, the Logic_sel_1 signal transitions from high to low and the Logic_sel_2 signal transitions from low to high, which causes the bitline path to switch from the select voltage path to the delivery voltage path. The circuits in FIGS. 4A and 4B are examples; different signals and circuitry may be used to detect thresholding of the memory cell and cause a switch from one voltage source to another.

Figure 5:
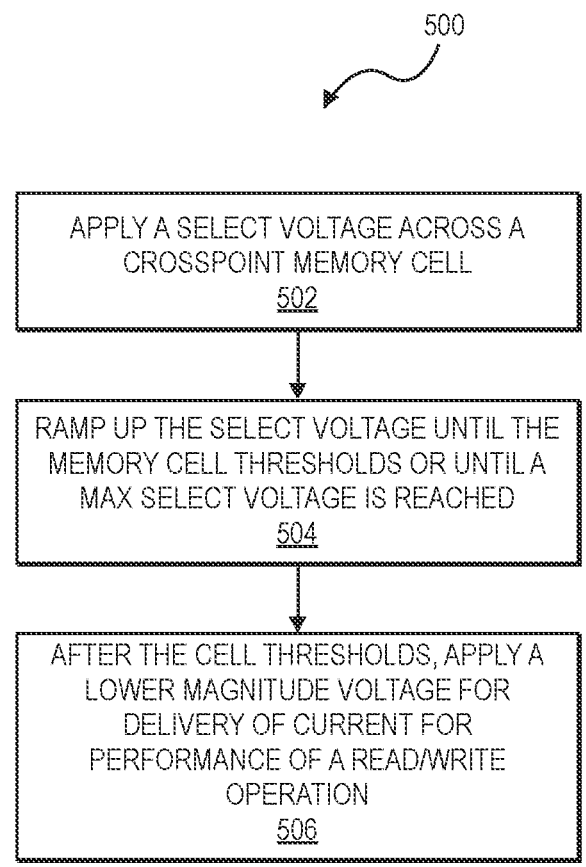
FIG. 5 is a flow diagram of a method of accessing a memory cell.

FIG. 5 is a flow diagram of a method of accessing a memory cell. Accessing a memory cell can involve, for example, selecting the memory cell and performing a read or write operation on the memory cell. The method 500 can be performed with circuitry (analog and/or digital circuitry) and/or microcode. The circuitry can include access and control circuitry on a same die or a same package as the memory array. Microcode can be stored in a storage structure on the same die or package as the memory array.

The method 500 begins with applying a select voltage across a crosspoint memory cell, at 502. For example, referring to FIG. 4A, the select voltage (SELECT_V_by_ED) is applied to the gate of the transistor 433, which causes a change in voltage at the node 407. When the path 451 is enabled, the voltage change at the node 407 causes a change in voltage across the memory cell 402. Applying a voltage to the gate of one of the transistors involves bringing the gate to the desired voltage relative to another baseline level (e.g., ground or other baseline level). Applying a voltage can involve applying a pulse or pulses or otherwise bringing the node in the circuit to the desired voltage. A voltage or current pulse is typically a rapid and transient change (e.g., increase or decrease) in voltage or current, respectively. For example, a voltage pulse may be defined as a rapid change from a first voltage level to a second voltage level, followed by a rapid return to the first voltage level. Pulses can have a variety of durations and shapes, such as rectangular, triangular, or other shapes.

The method then involves ramping up or otherwise increasing the select voltage until the memory cell thresholds or until a maximum select voltage is reached, at 504. In one example, ramping up the select voltage involves increasing the select voltage from a first voltage (e.g., a minimum or initial select voltage) to a second voltage (e.g., a maximum select voltage). In one example, the minimum select voltage is based on the lowest expected cell threshold voltage and the maximum select voltage is based on the highest expected cell threshold voltage. The select voltage can be ramped up in a variety of ways, such as with a continuous ramp, a staircase increase, or other waveform shapes. The select voltage may or may not reach the maximum select voltage depending on when the memory cell thresholds. A select voltage applied to a lower VT memory cell is unlikely to reach the maximum select voltage, whereas a select voltage applied to a higher VT memory cell may be ramped up to its maximum voltage before the memory cell thresholds.

Increasing the magnitude of the select voltage post-threshold can increase the cell current, which can contribute to read disturb and write endurance issues. Therefore, once the memory cell thresholds (e.g., the cell is selected), a lower magnitude voltage is applied across the memory cell for delivery of current for the read or write operation, at 506. Applying a lower magnitude voltage may involve switching from one voltage source to another or decreasing the applied voltage. Referring to FIG. 4A, the ramping selection voltage is deselected and a lower bias is applied (e.g., DELIVERY_V_by_ED). Once the delivery voltage is applied across the memory cell, current of a predetermined magnitude and duration is delivered to the memory cell for performance of the read or write operation.

Thus, slowly increasing the selection voltage and then switching to a lower delivery voltage can improve read disturb and write endurance issues in crosspoint memory. Controlling the ramp-rate of the selection voltage waveform can control the effective bias to select the memory cell and thus control the selection spike. The additional transient current which might be generated by further increasing the selection bias applied during read or write operation can be minimized. The reduction in transient current can be achieved dynamically by reducing the selection bias once the specific cell to read or write has been selected (e.g., low VT cells can have the voltage reduced earlier than high VT cells, leading to a bigger reduction in transient current for low VT cells). In addition, the selection ramp-rate and bias post-selection can be set differently depending on the cell location inside the memory array to further improve efficiency. Thus, the selection scheme described herein can improve read and write capability (e.g., the maximum number of reads or writes that can be applied without causing a read or write fail).

Figure 6:
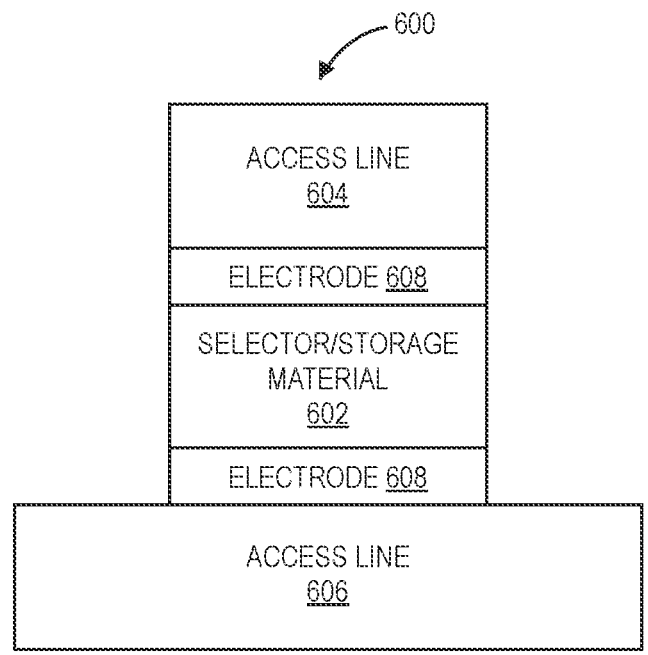
FIG. 6 is an example of a crosspoint memory cell.

FIG. 6 illustrates an example of a crosspoint memory cell that can be accessed using techniques described herein.

FIG. 6 illustrates a memory cell 600. The memory cell 600 includes one or more layers of material 602 to store data and aid in selection of the memory cell 600. For example, the memory cell 600 can include a storage material 602, a selector material, or both, between access lines 604 and 606. In one example, the memory cell includes a layer of storage material and a separate layer of selector material. In one example, the selector is a device with a threshold voltage and the storage element is a device with a tunable threshold voltage. In one example, the memory cell 600 includes a self-selecting material that exhibits both memory and selection effects. A self-selecting material is a storage material that enables selection of a memory cell in an array without requiring a separate layer of material for selection of the cell. In one example, a self-selecting memory cell includes a single layer of material that acts as both a selector element to select the memory cell and a memory element to store a logic state. A material exhibits memory effects if the material can be put in one of multiple stable states (e.g., via a write operation), and subsequently read back (e.g., via a read operation).

The techniques described herein apply generally to crosspoint memory and are not dependent on or specific to a particular storage material. However, some non-limiting examples of storage material follow.

In some examples, the storage material is a phase change material. In other examples, the storage material can be in one or multiple stable states without a change in phase. In one example, the memory element, switching element, or both are amorphous semiconductor threshold switches (e.g., ovonic threshold switches) using an amorphous material such as an amorphous chalcogenide material or other amorphous material. An ovonic threshold switch remains in an amorphous state which distinguishes it from an ovonic memory, which generally changes between amorphous and crystalline states. In one example, an ovonic memory is used in series with an ovonic threshold switch. In such case, the ovonic threshold switch operates as the select device for the ovonic memory. Whether the memory material of the memory cell changes phase or not, in one example, the memory could be referred to as a resistance-based memory. In a resistance-based memory, the bit stored by a memory cell is based on the resistive state of the memory cell.

Examples of storage material can include one or more of: tellurium (Te), selenium (Se), germanium (Ge), antimony (Sb), bismuth (Bi), lead (Pb), tin (Sn), indium (In), silver (Ag), arsenic (As), sulfur (S), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta) or other materials.

For example, the storage material may include one or more chalcogenide materials such as such as Te—Se, Ge—Te, In—Se, Sb—Te, Ge—Sb, Ta—Sb—Te, Ga—Sb, In—Sb, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, Sn—Sb—Bi, In—Sb—Ge, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, Se—As—Ge—Si—In, or other materials capable of being programmed to one of multiple states. One or more elements in a chalcogenide material may be dopants. For example, the storage material may include dopants such as: aluminum (Al), oxygen (O), nitrogen (N), silicon (Si), carbon (C), boron (B), zirconium (Zr), hafnium (Hf), or a combination thereof. The storage material may include other materials or dopants not explicitly listed.

As mentioned above, some memory cells include a separate layer of selector material to form a selector device. The selector material may include a chalcogenide material (e.g., a chalcogenide glass) or other material capable of operating as a selection element. In one example, the selector material includes one or more of: silicon (Si), germanium (Ge), selenium (Se), arsenic (As), tellurium (Te), or other materials. In one example, the selector material includes Si—Ge—As—Se, As—Ge—Te—Si, or other selector material. The selector material may also include dopants such as: aluminum (Al), oxygen (O), nitrogen (N), silicon (Si), carbon (C), boron (B), zirconium (Zr), hafnium (Hf), or a combination thereof. The selector material may include other materials or dopants not explicitly listed.

The access lines 604, 606 electrically couple the memory cell 100 with circuitry that provides power to and enables access to the memory cell 100. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data. The access lines 604, 606 can be referred to as a bit line and word line, respectively. The word line is for accessing a particular word in a memory array and the bit line is for accessing a particular bit in the word. The access lines 604, 606 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one example, electrodes 608 are disposed between storage material 602 and access lines 604, 606. Electrodes 608 electrically couple access lines 604, 606 with storage material 602. A memory cell with separate layers of storage and selector material may also include an electrode between the layers of storage and selector material. Electrodes 608 can be composed of one or more conductive and/or semi-conductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials.

Figure 7:
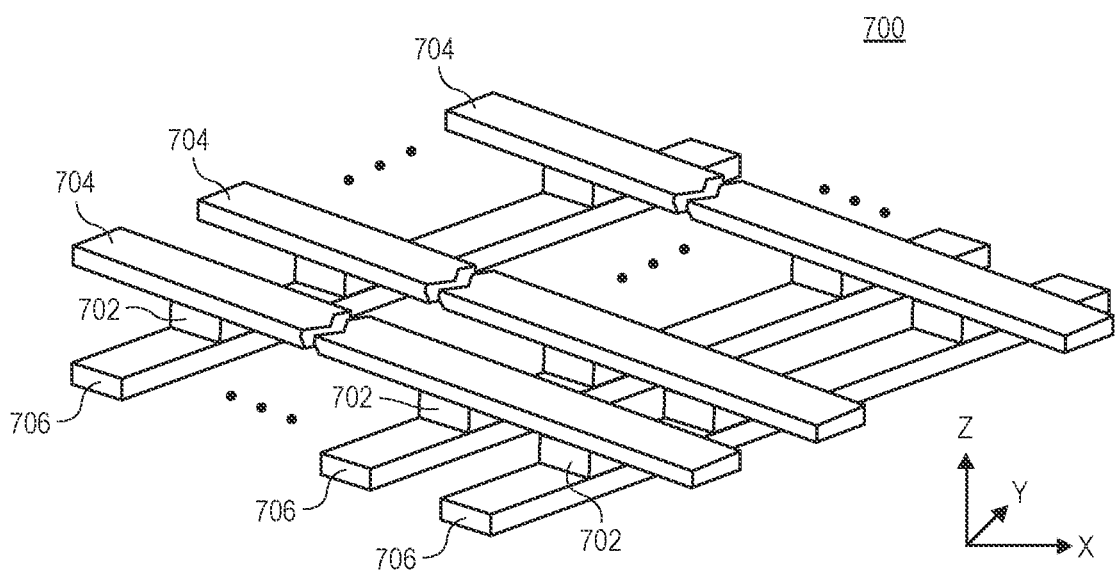
FIG. 7 illustrates an example of a portion of a memory cell array.

FIG. 7 illustrates a portion of a memory cell array 700, which can include a memory cell such as the memory cell 106 of FIG. 1 or memory cell 600 of FIG. 6. The memory cell array 700 is an example of a cross-point memory array. The memory cell array 700 includes a plurality of access lines 704, 706, which can be the same or similar as the access lines 604, 606 described with respect to FIG. 6. Access lines 704, 706 can be referred to as bit lines and word lines. In the example illustrated in FIG. 7, the bit lines (e.g., access lines 704) are orthogonal to the word lines (e.g., access lines 706). A storage material 702 is disposed between the access lines 704, 706. In one example, a "cross-point" is formed at an intersection between a bit line and a word line. A memory cell is created from the storage material 702 between the bit line and word line where the bit line and word line intersect. The storage material 702 can be a chalcogenide material, phase change material, both a chalcogenide material and phase change material, or other storage material. In one example, the access lines 704, 706 are composed of one or more conductive materials such as the access lines 604, 606 described above with respect to FIG. 6.

Although a single level or tier of memory cells is shown in FIG. 7 for the sake of clarity, memory cell array 700 typically includes multiple levels or tiers of non-volatile memory cells (e.g., in the z-direction). Nonvolatile memory devices including multiple tiers of cross-point memory cells may be referred to as three-dimensional (3D), multi-level, or multi-tiered cross-point memory devices. The FIGS. 6 and 7 illustrate an example of a memory cell and array in which techniques described herein may be implemented. However, the techniques described herein can be implemented in memory cell structures and arrays having different materials or structures than the examples described in FIGS. 6 and 7.

Figure 8:
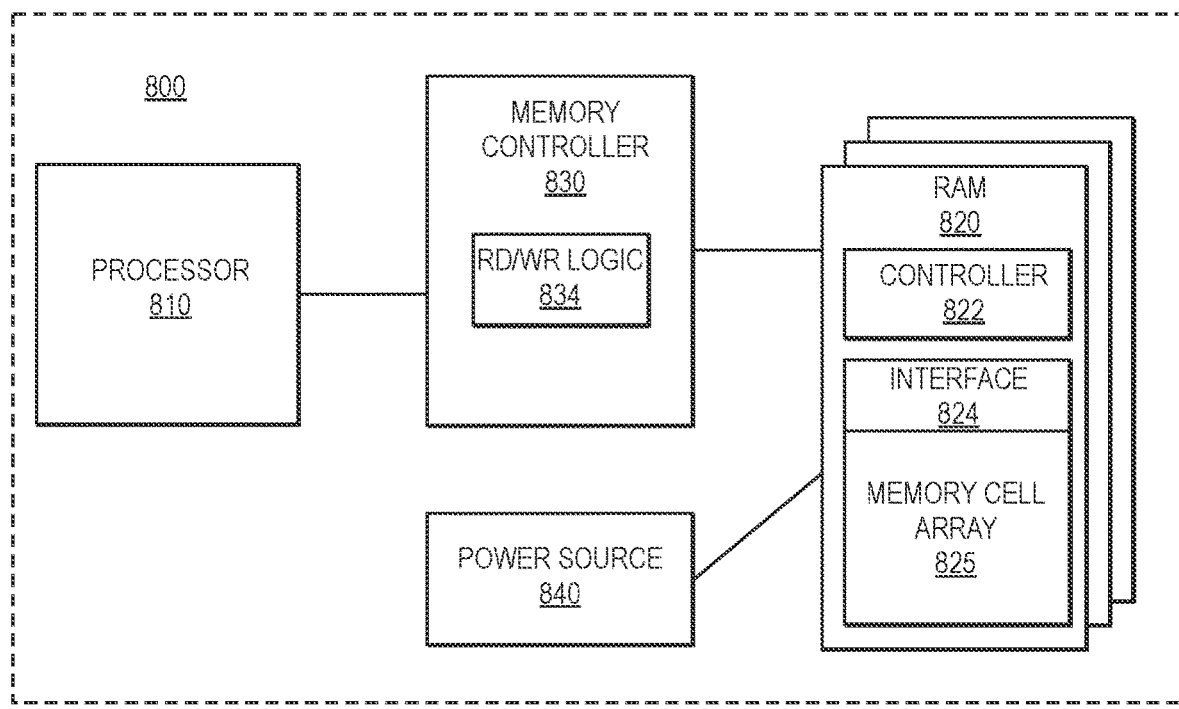
FIG. 8 is a block diagram of a system that can include a non-volatile memory device that implements access techniques described herein.

FIG. 8 is a block diagram of a system that can include a non-volatile memory device in accordance with examples described herein.

System 800 includes components of a memory subsystem having random access memory (RAM) 820 to store and provide data in response to operations of processor 810. The system 800 receives memory access requests from a host or a processor 810, which is processing logic that executes operations based on data stored in RAM 820 or generates data to store in RAM 820. The processor 810 can be or include a host processor, central processing unit (CPU), microcontroller or microprocessor, graphics processor, peripheral processor, application specific processor, or other processor, and can be single core or multicore.

The system 800 includes a memory controller (e.g., host memory controller) 830, which represents logic to interface with RAM 820 and manage access to data stored in the memory. In one example, the memory controller 830 is integrated into the hardware of processor 810. In one example, the memory controller 830 is standalone hardware, separate from the processor 810. The memory controller 830 can be a separate circuit on a substrate that includes the processor. The memory controller 830 can be a separate die or chip integrated on a common substrate with a processor die (e.g., as a system on a chip (SoC)). In one example, the memory controller 830 is an integrated memory controller (iMC) integrated as a circuit on the processor die. In one example, at least some of RAM 820 can be included on an SoC with the memory controller 830 and/or the processor 810.

In the illustrated example, the memory controller 830 includes read/write logic 834, which includes hardware to interface with the RAM 820. The logic 834 enables the memory controller 830 to generate read and write commands to service requests for data access generated by the execution of instructions by processor 810.

The memory resources or cachelines in the RAM 820 are represented by a memory cell array 825, which can include a crosspoint array. The RAM 820 includes an interface 824 (e.g., interface logic) to control the access to the memory device array 825. The interface 824 can include decode logic, including logic to address specific rows or columns, bit lines or word lines, or otherwise address specific bits of data. The controller 822 represents an on-die controller on RAM 820 to control its internal operations to execute commands received from memory controller 830. For example, the controller 822 can control any of timing, voltage levels, addressing, I/O (input/output) margining, scheduling, and error correction for RAM 820.

In one example, the controller 822 is configured to read and write to the memory device array 825 in accordance with any example described herein. A power source 840 is connected to the RAM 820 to provide one or more voltage rails for operation of the RAM 820.

Figure 9:
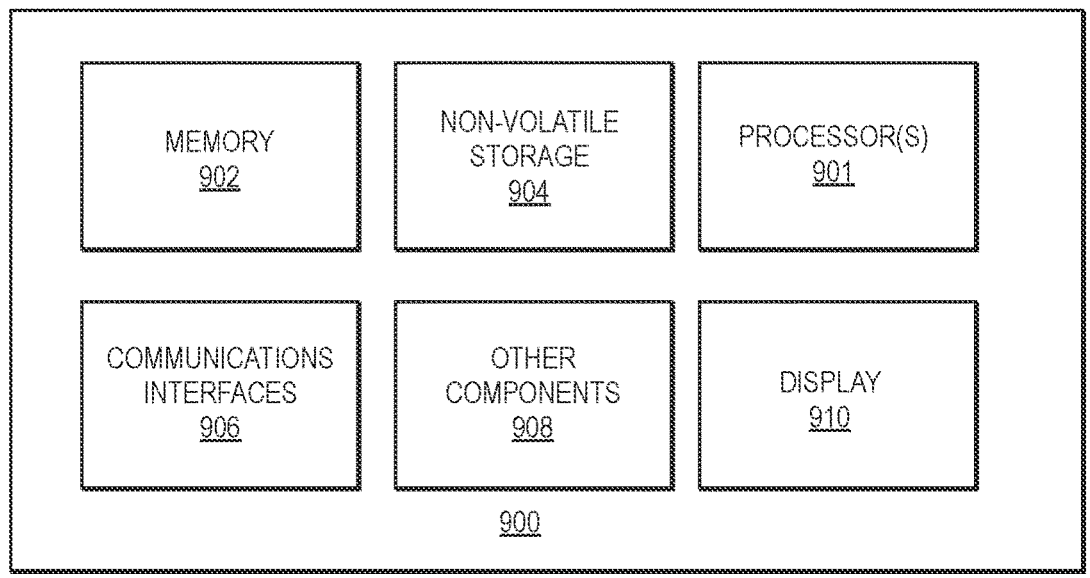
FIG. 9 provides an exemplary depiction of a computing system that can include a non-volatile memory device that implements access techniques described herein.

FIG. 9 provides an exemplary depiction of a computing system 900 (e.g., a smartphone, a tablet computer, a laptop computer, a desktop computer, a server computer, etc.). As observed in FIG. 9, the system 900 may include one or more processors or processing units 901. The processor(s) 901 may include one or more central processing units (CPUs), each of which may include, e.g., a plurality of general-purpose processing cores. The processor(s) 901 may also or alternatively include one or more graphics processing units (GPUs) or other processing units. The processor(s) 901 may include memory management logic (e.g., a memory controller) and I/O control logic. The processor(s) 901 can be similar to, or the same as, the processor 810 of FIG. 8.

The system 900 also includes memory 902 (e.g., system memory), non-volatile storage 904, communications interfaces 906, a display 910 (e.g., touchscreen, flat-panel), and other components 908. The other components may include, for example, a power supply (e.g., a battery or/or other power supply), sensors, power management logic, or other components. The communications interfaces 906 may include logic and/or features to support a communication interface. For these examples, communications interface 906 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 904, which may be the mass storage component of the system. The non-volatile storage 904 can be similar to, or the same as, the RAM 820 of FIG. 8, described above. Non-volatile storage 904 may include byte or block addressable types of non-volatile memory having a cross-point memory structure. Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 904 may include mass storage that is composed of one or more SSDs (solid state drives), DIMMs (dual in line memory modules), or other module or drive. The non-volatile storage 904 may implement selection and access techniques in accordance with examples described herein.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A circuit comprising:
   a memory cell of a crosspoint memory array; and
   circuitry to:
      apply a first select voltage across the memory cell of the crosspoint memory array with a first voltage source, wherein the magnitude of the first select voltage is based on a location of the memory cell in the crosspoint memory array;
      increase the magnitude of a voltage applied across the memory cell from the first select voltage to a second select voltage, wherein a ramp rate from the first select voltage to the second select voltage is based on the location of the memory cell in the crosspoint memory array;
      detect thresholding of the memory cell; and
      apply a third voltage with a lower magnitude than the second select voltage across the memory cell in response to detection of the thresholding of the memory cell.

2. The circuit of claim 1, wherein the circuitry to increase the magnitude of the voltage applied across the memory cell is to:
   increase the voltage applied across the memory cell with a constant slope.

3. The circuit of claim 1, wherein the circuitry to increase the magnitude of the voltage applied across the memory cell is to:
   increase the voltage applied across the memory cell in steps.

4. The circuit of claim 1, wherein the circuitry to detect the thresholding of the memory cell is to:
   detect a change in voltage across or current through the memory cell.

5. The circuit of claim 1, wherein:
   the magnitude of the second select voltage is less than or equal to the magnitude of a maximum select voltage; and
   the maximum select voltage is based on the location of the memory cell in the crosspoint memory array.

6. The circuit of claim 1, wherein:
   the magnitude of the first select voltage is lower than the magnitude of the third voltage.

7. The circuit of claim 1, wherein:
   the magnitude of the first select voltage is lower than or equal to a minimum expected threshold voltage magnitude.

8. The circuit of claim 7, wherein:
   the magnitude of the second select voltage is greater than the magnitude of the first select voltage and greater than or equal to a maximum expected threshold voltage magnitude.

9. A memory device comprising:
   a crosspoint memory array; and
   circuitry to:
      apply a first select voltage across a memory cell of the crosspoint memory array with a first voltage source, wherein the magnitude of the first select voltage is based on a location of the memory cell in the crosspoint memory array;
      increase the magnitude of a voltage applied across the memory cell from the first select voltage to a second select voltage, wherein a ramp rate from the first select voltage to the second select voltage is based on the location of the memory cell in the crosspoint memory array;
      detect thresholding of the memory cell; and
      apply a third voltage with a lower magnitude than the second select voltage across the memory cell in response to detection of the thresholding of the memory cell.

10. The memory device of claim 9, wherein the circuitry to increase the magnitude of the voltage applied across the memory cell is to:
   increase the voltage applied across the memory cell with a constant slope.

11. The memory device of claim 9, wherein the circuitry to increase the magnitude of the voltage applied across the memory cell is to:

increase the voltage applied across the memory cell in steps.

12. The memory device of claim 9, wherein the circuitry to detect the thresholding of the memory cell is to:
detect a change in voltage across or current through the memory cell.

13. The memory device of claim 9, wherein:
the magnitude of the second select voltage is less than or equal to the magnitude of a maximum select voltage; and
the maximum select voltage is based on the location of the memory cell in the crosspoint memory array.

14. A system comprising:
a memory controller; and
a memory die in a same package as the memory controller, the memory die comprising:
a crosspoint memory array; and
circuitry to:
apply a first select voltage across a memory cell of the crosspoint memory array with a first voltage source, wherein the magnitude of the first select voltage is based on a location of the memory cell in the crosspoint memory array;
increase the magnitude of a voltage applied across the memory cell from the first select voltage to a second select voltage, wherein a ramp rate from the first select voltage to the second select voltage is based on the location of the memory cell in the crosspoint memory array;
detect thresholding of the memory cell; and
apply a third voltage with a lower magnitude than the second select voltage across the memory cell in response to detection of the thresholding of the memory cell.

15. The system of claim 14, further comprising:
one or more of: a processor, a host memory controller, a display, and a power source.

16. The system of claim 14, wherein:
the memory die is included in a solid state drive (SSD).

17. The system of claim 14, wherein:
the memory die is included in a dual in line memory module (DIMM).

18. A circuit comprising:
a memory cell of a crosspoint memory array; and
circuitry to:
apply a first select voltage across the memory cell of the crosspoint memory array;
increase the magnitude of a voltage applied across the memory cell from the first select voltage to a second select voltage, wherein a ramp rate from the first select voltage to the second select voltage is based on the location of the memory cell in the crosspoint memory array;
detect thresholding of the memory cell; and
apply a third voltage with a lower magnitude than the second select voltage across the memory cell in response to detection of the thresholding of the memory cell, wherein the magnitude of the third voltage is based on a location of the memory cell in the crosspoint memory array.

19. The circuit of claim 18, wherein:
the magnitude of the first select voltage is lower than the magnitude of the third voltage.

* * * * *